(12) United States Patent
Labeye et al.

(10) Patent No.: US 9,715,072 B2
(45) Date of Patent: Jul. 25, 2017

(54) OPTICAL COUPLER PROVIDED WITH AN INTERMEDIATE WAVEGUIDE

(71) Applicant: Commissariat à l'énergie atomique et aux énergies alternatives, Paris (FR)

(72) Inventors: Pierre Labeye, Grenoble (FR); Salim Boutami, Grenoble (FR); Mickaël Brun, Eybens (FR); Sergio Nicoletti, Sinard (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 23 days.

(21) Appl. No.: 14/904,712

(22) PCT Filed: Jul. 11, 2014

(86) PCT No.: PCT/EP2014/064992
§ 371 (c)(1),
(2) Date: Apr. 18, 2016

(87) PCT Pub. No.: WO2015/007663
PCT Pub. Date: Jan. 22, 2015

(65) Prior Publication Data
US 2016/0246020 A1   Aug. 25, 2016

(30) Foreign Application Priority Data
Jul. 15, 2013  (FR) ..................... 13 56952

(51) Int. Cl.
G02B 6/122  (2006.01)
G02B 6/24   (2006.01)
(Continued)

(52) U.S. Cl.
CPC ....... G02B 6/4291 (2013.01); G02B 6/12002 (2013.01); G02B 6/122 (2013.01);
(Continued)

(58) Field of Classification Search
CPC ........................... G02B 6/4291; G02B 6/1228
See application file for complete search history.

(56) References Cited

U.S. PATENT DOCUMENTS 6,411,765 B1   6/2002  Ono
7,221,825 B2 * 5/2007  Reed ................. G02B 6/12002
                                                          385/129

(Continued)

OTHER PUBLICATIONS

International Search Report for PCT/EP2014/064992 dated Oct. 2, 2014.

(Continued)

*Primary Examiner* — Michelle R Connelly
(74) *Attorney, Agent, or Firm* — B. Aaron Schulman, Esq.; Stites & Harbison, PLLC

(57) ABSTRACT

The invention relates to an optical coupler (10) in a vertical configuration, comprising a first waveguide (12) and a second waveguide (14). The optical coupler (10) comprises a third waveguide (16) distinct from the first and second waveguides (12, 14) and extending parallel to the first and second waveguides (12, 14), the third waveguide (16) being arranged between the first waveguide (12) and the second waveguide (14) in a transverse direction (X) perpendicular to the longitudinal direction (Z) and having parameters influencing the evanescent wave coupling between the first waveguide (12) and the second waveguide (14), those parameters being chosen such that the coupling (C) is greater than 15%.

13 Claims, 3 Drawing Sheets

Figure 1:
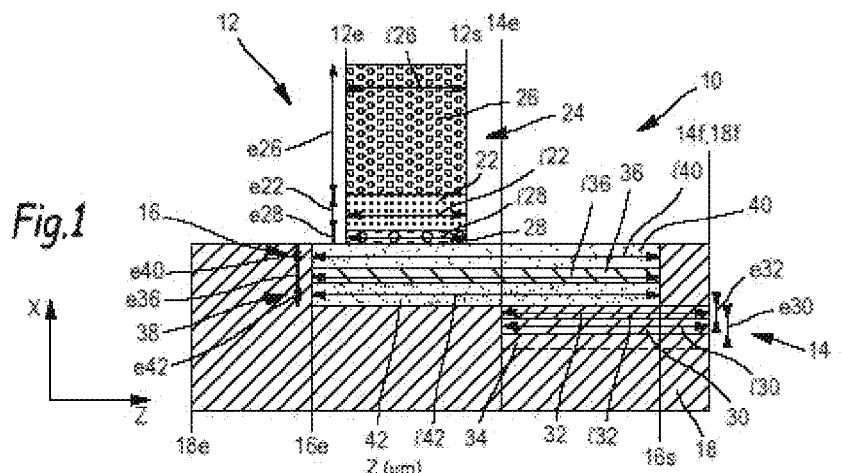

(51) Int. Cl.
G02B 6/42 (2006.01)
G02B 6/12 (2006.01)
G02B 6/293 (2006.01)
H01S 5/026 (2006.01)
H01S 5/30 (2006.01)

(52) U.S. Cl.
CPC ..... *G02B 6/12004* (2013.01); *G02B 6/29332* (2013.01); *H01S 5/026* (2013.01); *H01S 5/3013* (2013.01); *G02B 2006/12147* (2013.01)

(56) References Cited

U.S. PATENT DOCUMENTS

| | | | |
|---|---|---|---|
| 8,787,712 B2* | 7/2014 | Grondin | B82Y 20/00 |
| | | | 385/14 |
| 9,128,240 B2* | 9/2015 | Hatori | G02B 6/12 |
| 9,310,558 B2* | 4/2016 | Huang | G02B 6/26 |
| 2002/0154848 A1 | 10/2002 | Shimonaka | |
| 2002/0181875 A1 | 12/2002 | Lauzon et al. | |
| 2003/0063836 A1* | 4/2003 | Lam | G02B 6/12002 |
| | | | 385/14 |
| 2006/0182402 A1 | 8/2006 | Blauvelt | |
| 2011/0116741 A1* | 5/2011 | Cevini | G02B 6/305 |
| | | | 385/28 |
| 2016/0077283 A1* | 3/2016 | Webster | G02B 6/122 |
| | | | 385/14 |

OTHER PUBLICATIONS

French Search Report for FR 1356952 dated Feb. 25, 2014.
Written Opinion of the International Searching Authority for PCT/EP2014/064992 dated Oct. 2, 2014.

* cited by examiner

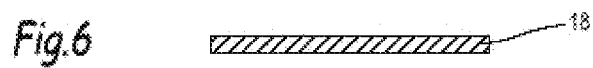
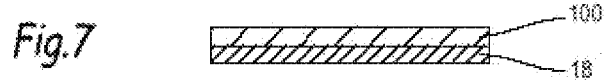
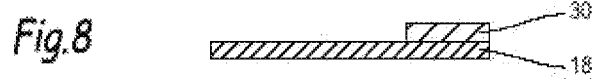
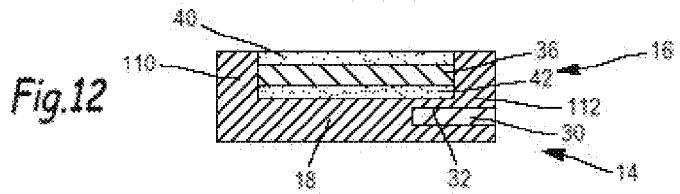
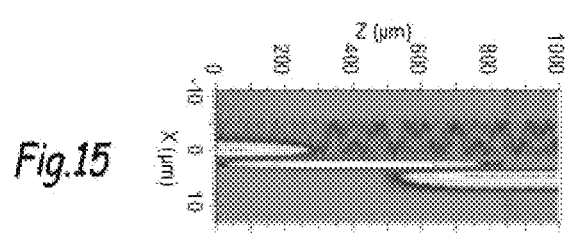
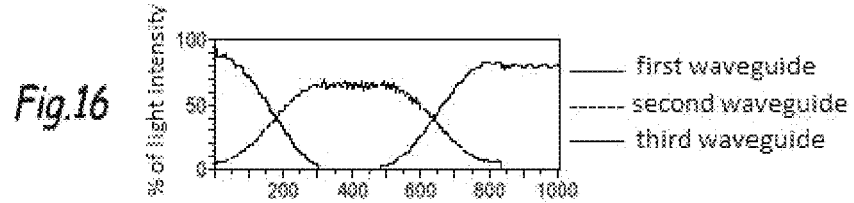

OPTICAL COUPLER PROVIDED WITH AN INTERMEDIATE WAVEGUIDE

The present invention relates to an optical coupler, a component comprising such an optical coupler, a determination method, and a method for manufacturing such an optical coupler.

The invention is situated in the field of the heterogeneous integration of laser sources on an integrated optical structure. Such integrations are applicable in various fields using components from integrated photonics. Applications include optical telecommunications, optical sensors and biophotonics. For these different applications, there is a need for structures making it possible to guide the light effectively.

Integrated photonics developed on substrates such as glass, silicon or III-V materials. It will be recalled that a semiconductor of type "III-V" is a composite semiconductor manufactured from one or more elements from column III of the periodic table of elements (boron, aluminum, gallium, indium, etc.) and one or more elements from column V or pnictogens (nitrogen, phosphorus, arsenic, antimony, etc.). It is desirable instead to use silicon substrates, since silicon substrates make it possible to integrate both optical components and electronic components.

However, no monolithic laser source effective on silicon yet exists. To offset this problem, heterogeneous laser source integrations using III-V materials on a silicon substrate are generally used.

To obtain effective coupling of the laser light created by the laser source in the III-V material with a silicon guiding structure, it has been proposed to use evanescent waves to couple a passive waveguide of the silicon guide structure with the laser source. The coupling is related to the ratio between the amplitude of the electric field of the wave circulating in the passive waveguide and the amplitude of the electric field of the wave emitted by the laser source. More specifically, the coupling is defined by formula $C=I2/(I1+I2)$, where $C$ is the coupling, $I1$ is the intensity of the electric field in the laser, and $I2$ is the intensity of the electric field in the passive waveguide. Furthermore, it will be recalled that a passive waveguide is a waveguide with no active element.

The obtainment of the coupling between the laser source and the passive waveguide requires that the laser source be very close to the passive waveguide. The coupling in fact greatly depends on the spacing between the laser source and the passive waveguide. This proximity is often difficult to obtain in practice, since the passive waveguide should be protected by depositing an insulating layer degrading the laser source, in particular due to the temperature at which the deposition is done.

To avoid this problem, document WO-A-03/054,596 proposes producing a passive waveguide including an optical relief with gradual efficiency.

However, this type of structure is difficult to produce in a technology involving silicon.

Additionally, more generally, the passive waveguide includes a core and a cladding as the laser source. When the optical index of the core of the laser source is lower than the optical index of the gain of the passive waveguide, leaks of the guided mode(s) in the core of the laser source occur toward the cladding of the passive waveguide.

There is therefore a need for an optical coupler limiting the leaks of the guided modes in the laser source toward the substrate.

To that end, the invention relates to an optical coupler in a vertical configuration comprising a first waveguide extending in a longitudinal direction, the first waveguide including a first core and a first cladding each having an optical index and a second waveguide distinct from the first waveguide and extending parallel to the first waveguide, the second waveguide including a second core and a second cladding having an optical index, the optical index of the first core of the first waveguide being lower than the optical index of the second cladding of the second waveguide. The optical coupler further comprises a third waveguide distinct from the first and second waveguides and extending parallel to the first and second waveguides, the third waveguide being arranged between the first waveguide and the second waveguide in a transverse direction perpendicular to the longitudinal direction and having parameters influencing the evanescent wave coupling between the first waveguide and the second waveguide, those parameters being chosen such that the coupling is greater than 15%.

Such a coupler limits the leaks of the guided modes in the laser source toward the substrate.

Such an optical coupler makes it possible to obtain better coupling. The optical coupler is easy to manufacture, since only techniques from microelectronics are used.

According to specific embodiments, the optical coupler comprises one or more of the following features, considered alone or according to any technically possible combinations:
- said parameters of the third waveguide influencing the evanescent wave coupling between the first waveguide and the second waveguide are chosen such that the coupling is greater than 30%, preferably greater than 50%.
- the third waveguide includes an upper layer, a lower layer and a third core, said parameters of the third waveguide influencing the evanescent wave coupling between the first waveguide and the second waveguide being the dimensions in two perpendicular directions as well as the optical indices of the upper layer, the lower layer and the third core.
- the third waveguide includes a third cladding and a third core, each cladding of a waveguide having an optical index lower than the optical index of the core of each waveguide adjacent to the waveguide of the considered cladding.
- the first waveguide is an active waveguide and the second and third waveguides are passive waveguides.
- the first core is made from a material belonging to column III of the periodic table formed with a material according to column V of the periodic table and two lower and upper layers surrounding the core.
- the third waveguide includes an upper layer, a lower layer and a core, the third core of the third waveguide having a variable dimension along the transverse direction.
- the optical coupler includes a substrate, made from a first material that is preferably silicon, in which the second waveguide and the third waveguide are buried, the first waveguide being arranged in contact with the substrate and made from a material different from the first material.
- the second waveguide is at a distance of at least 5 millimeters from the first waveguide in the transverse direction.
- the optical coupler further comprises a fourth waveguide distinct from the first, second and third waveguides and extending parallel to the first, second and third waveguides, the fourth waveguide being arranged between the third waveguide and the second waveguide and having parameters influencing the evanescent wave coupling between the first waveguide and the second waveguide, the set of parameters of the third waveguide and the fourth waveguide being chosen such that the coupling is greater than 15%.

the parameters of the third waveguide and the fourth waveguide influencing the evanescent wave coupling between the first waveguide and the second waveguide are chosen such that the coupling is greater than 30%, preferably greater than 50%.

The invention also relates to an optical component including an optical coupler as previously described.

Furthermore, the present invention also relates to a method for determining parameters of an optical coupler in a vertical configuration comprising a first waveguide extending in a longitudinal direction, the first waveguide including a first core and a first cladding each having an optical index and a second waveguide distinct from the first waveguide and extending parallel to the first waveguide, the second waveguide including a second core and a second cladding having an optical index, the optical index of the first core of the first waveguide being lower than the optical index of the second cladding of the second waveguide, and a third waveguide distinct from the first and second waveguides and extending parallel to the first and second waveguides. The third waveguide is arranged between the first waveguide and the second waveguide in a transverse direction perpendicular to the longitudinal direction and having parameters influencing the evanescent wave coupling between the first waveguide and the second waveguide. The determination method includes a step for choosing parameters such that the coupling is greater than 15%.

Furthermore, the invention also relates to a method for manufacturing an optical coupler as previously described, comprising steps for manufacturing different waveguides involving techniques for deposition, epitaxy, polishing and material removal by etching.

The manufacturing method makes it possible to obtain the optical coupler previously described using only microelectronics techniques. Such techniques are particularly easy to implement.

Figure 2:
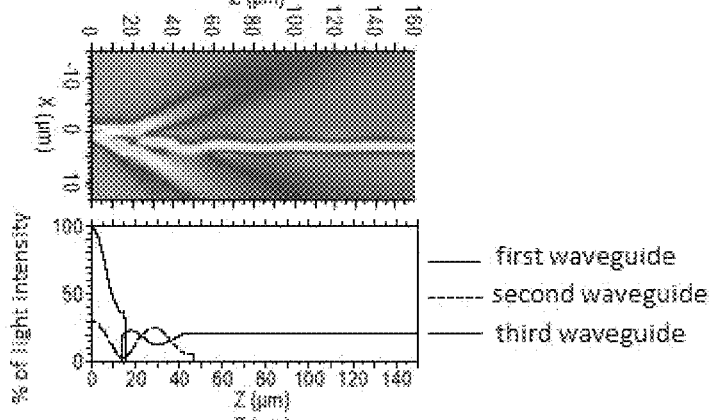
Figure 3:
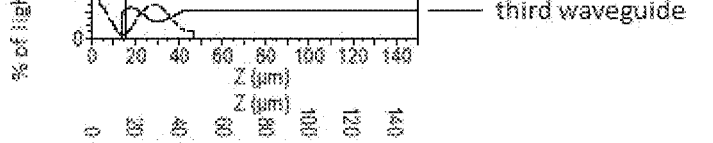
Figure 4:
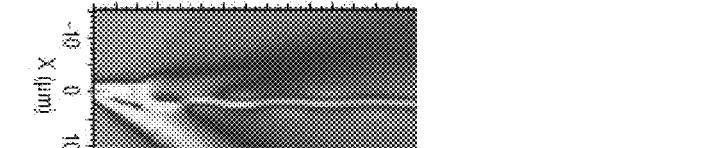
Figure 5:
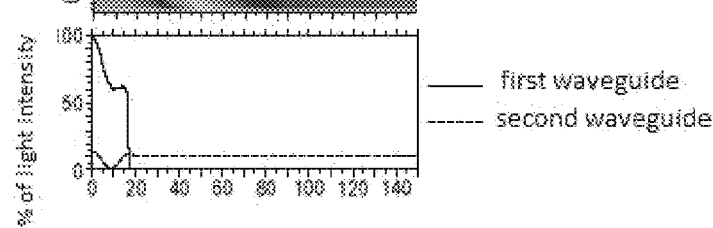
Figure 13:
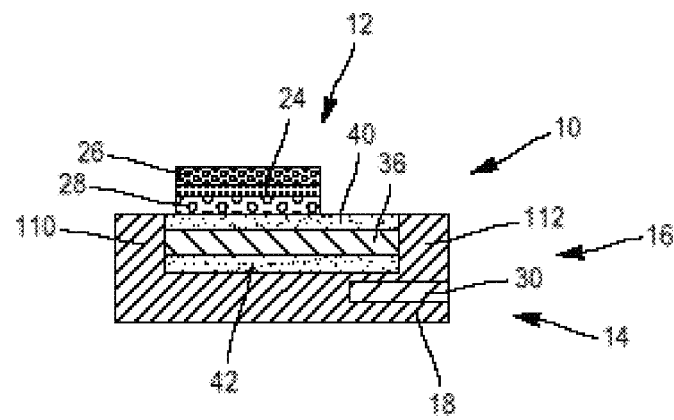
Figure 14:
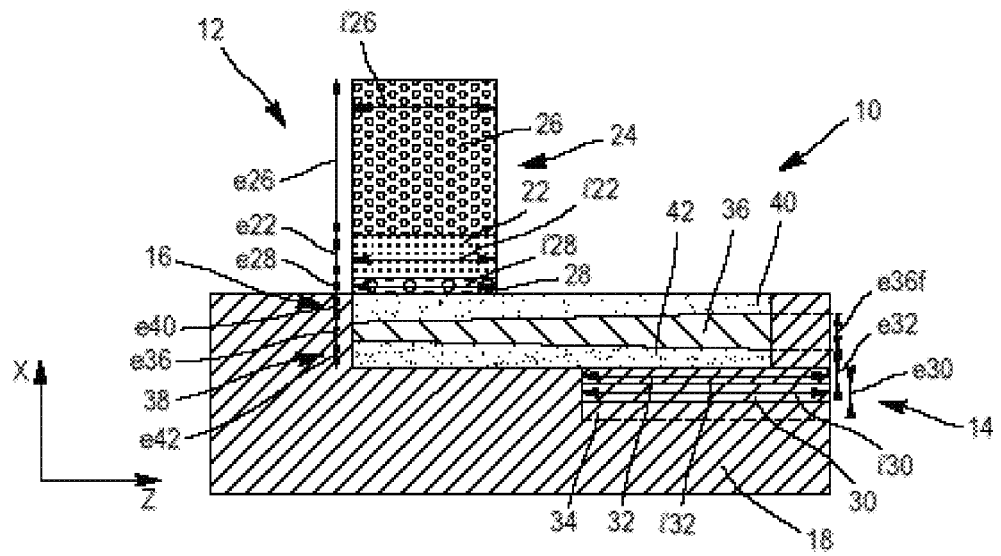

Other features and advantages of the invention will appear upon reading the following description of embodiments of the invention, provided as an example only and in reference to the drawings, which are:

FIG. 1, a diagrammatic cross-sectional view of an optical coupler according to a first embodiment of the invention, FIG. 2, a mapping of the electrical field in the optical coupler according to FIG. 1 during operation, FIG. 3, a graph showing the spatial evolution of the distribution of the coupling in the different waveguides for the optical coupler according to FIG. 1, FIG. 4, a mapping of the electric field in an optical coupler according to the state of the art, FIG. 5, a graph showing the spatial evolution of the distribution of the coupling in the different waveguides for the optical coupler according to the state of the art considered in FIG. 4, FIGS. 6 to 13, diagrammatic cross-sectional illustrations of the element obtained at different stages of the implementation of the method for manufacturing the optical coupler according to the first embodiment illustrated by FIG. 1, FIG. 14, a diagrammatic cross-sectional view of an example of an optical coupler according to a second embodiment of the invention.

FIG. 15, a mapping of the electrical field in the optical coupler according to FIG. 14 during operation, and FIG. 16, a graph showing the spatial evolution of the distribution of the coupling in the different waveguides for the optical coupler according to FIG. 14, In the context of the invention, an optical coupler 10 is proposed as shown in FIG. 1.

This coupler 10 is in a vertical configuration, i.e., a configuration in which this optical coupler 10 is capable of coupling light between two guides offset in a transverse direction perpendicular to a general propagation direction of the light.

The optical coupler 10 comprises a first waveguide 12 extending in a longitudinal direction Z, and a second waveguide 14 distinct from the first waveguide 12 and extending parallel to the first waveguide 12.

The first waveguide 12 includes a first core 22 and a first cladding 24.

The second waveguide 14 includes a second core 30 and a second cladding 32.

The optical index of the core 22 of the first waveguide 12 is below the optical index of the cladding of the second waveguide 14.

The optical coupler 10 comprises a third waveguide 16 distinct from the first and second waveguides 12, 14 and extending parallel to the first and second waveguides 12, 14.

The third waveguide 16 is arranged between the first waveguide 12 and the second waveguide 14 in a transverse direction perpendicular to the longitudinal direction.

The third waveguide 16 has parameters influencing the evanescent wave coupling C between the first waveguide 12 and the second waveguide 14, these parameters being chosen such that the coupling C is greater than 15%. As a reminder, in the context of the invention, it is chosen to express the coupling C as the ratio between the intensity of the electric field of the wave circulating in the second waveguide 14 and the sum of the intensities of the electric fields of the waves circulating in the first waveguide 12 and the second waveguide 14.

Each parameter characterizing the third waveguide 16 is a parameter influencing the third waveguide 16 influencing the evanescent wave coupling between the first waveguide 12 and the second waveguide 14.

When the first waveguide 12 is supplied with power, the first waveguide 12 emits light in the form of waves guided in the core of the first waveguide 12.

Part of the waves guided in the first waveguide 12 then couples with the third waveguide 16 by evanescent waves. Waves are then guided in the core of the third waveguide 16.

Part of the waves guided in the third waveguide 16 then couples with the second waveguide 14 by evanescent waves. Waves are then guided in the core of the second waveguide 14.

The optical coupler 10 is capable of coupling light guided in the first waveguide 12 toward the second waveguide 14 via the third waveguide 16. The third waveguide 16 therefore serves as an intermediate waveguide.

The coupler 10 makes it possible to avoid the problem of leaking in the cladding of the second waveguide 14 of the mode guided in the first waveguide 12. The introduction of the third waveguide 16 prevents such a leak. Furthermore, such an introduction optically insulates the second waveguide 14 with respect to the outside environment of the coupler 10.

Using the coupler 10 according to the invention makes it possible to obtain a gain by a factor two in terms of coupling.

This better coupling is obtained while preserving easy manufacturing. In fact, a manufacturing method may be used using only microelectronics techniques. Such a manufacturing method comprises steps for manufacturing waveguides involving techniques for deposition, epitaxy, polishing, gluing and material removal by etching.

Preferably, the parameters influencing the evanescent wave coupling between the first waveguide 12 and the second waveguide 14 are chosen such that the coupling C is greater than 30%, preferably greater than 50%.

Typically, in the case where the third waveguide 16 includes an upper layer, a lower layer and a core, the core being situated between the upper and lower layers, said parameters of the third waveguide 16 influencing the evanescent wave coupling between the first waveguide and the second waveguide are the dimensions in two perpendicular directions as well as the optical indices of the upper layer, the lower layer and the core. Alternatively, other parameters are used to characterize the third waveguide 16. In particular, a linear combination of the preceding parameters is interesting.

The increased coupling between the first waveguide 12 and the second waveguide 14 relative to the coupling obtained in the state of the art is still more sensitive in the event each waveguide 12, 14, 16 includes a cladding and a core, each cladding of a waveguide having an optical index below the optical index of the core of each waveguide 12, 14, 16 adjacent to the waveguide 12, 14, 16 of the considered cladding. In fact, in that case, in the absence of a third waveguide 16, the coupling is zero.

Preferably, the first waveguide 12 is an active waveguide, i.e., a waveguide provided with active elements, while the second waveguide 14 is a passive waveguide, or a waveguide with no active element. Likewise, the third waveguide 16 is also a passive waveguide.

The increased coupling between the first waveguide 12 and the second waveguide 14 is also obtained by making the dimension of the core of the third waveguide 16 variable along the direction perpendicular to the propagation direction of the light.

Preferably, the second waveguide 14 is at a distance of at least 5 millimeters from the first waveguide 12 in the transverse direction, perpendicular to the light propagation direction. This makes it possible to insulate the second waveguide 14 from the environment of the first waveguide 12.

According to one preferred embodiment, the first waveguide 12 includes a core made from a material belonging to column III of the periodic table formed with a material according to column V of the periodic table and two lower and upper layers surrounding the core. This technology makes it easier to produce the first waveguide 12.

To increase this effect, according to one alternative, the optical coupler 10 includes a substrate, made from a first material, in which the second waveguide 14 and the third waveguide 16 are buried, the first waveguide 12 being arranged in contact with the substrate and made from a material different from the first material. In fact, in that case, the substrate also contributes to the insulation of the second waveguide 14 relative to the environment.

In order to still further increase this effect, according to another alternative, the optical coupler 10 further comprises a fourth waveguide distinct from the first, second and third waveguides 12, 14, 16 extending parallel to the first, second and third waveguides 12, 14, 16, the fourth waveguide being arranged between the third waveguide 16 and the second waveguide 14 and having parameters influencing the evanescent wave coupling between the first waveguide 12 and the second waveguide 14. All of the parameters of the third waveguide 16 and the fourth waveguide are then chosen such that the coupling is greater than 15%.

Preferably, the parameters of the third waveguide 16 and the fourth waveguide influencing the evanescent wave coupling between the first waveguide 12 and the second waveguide 14 are chosen such that the coupling C is greater than 30%, or preferably greater than 50%.

Hereinafter, specific embodiments are described more precisely. This is in particular the case for the optical coupler 10 of FIG. 1.

For the rest of the description, a longitudinal direction is defined corresponding to a general propagation direction of the light. A transverse direction is also defined perpendicular to the longitudinal direction and contained in the plane of FIG. 1. The longitudinal and transverse directions are respectively symbolized by an axis Z and an axis X in FIG. 1. Thus, the third waveguide 16 is arranged between the first waveguide 12 and the second waveguide 14 in the transverse direction X.

Furthermore, when the term "index" is used for a medium, that term refers to the refraction index of that medium, which is a property without characteristic dimension of that medium and describing the behavior of the light in that medium. In the event the medium has an index gradient, the term "index" refers to the mean of the index in that medium.

As previously indicated, FIG. 1 shows an optical coupler 10, including a first waveguide 12, a second waveguide 14 and a third waveguide 16 arranged between the first waveguide 12 and the second waveguide 14 in the transverse direction X. The optical coupler 10 comprises a substrate 18 in which the second waveguide 14 and the third waveguide 16 are buried, the first waveguide 12 resting on the substrate 18.

The optical coupler 10 is capable of coupling light from the first waveguide 12 toward the second waveguide 14.

As previously defined, "vertical configuration" refers to a configuration in which the optical coupler is capable of coupling light between two guides offset in the transverse direction X. Conversely, "horizontal configuration" refers to a configuration in which the optical coupler is capable of coupling light between two guides aligned along the transverse direction X. In the example of FIG. 1, the optical coupler 10 is in a vertical configuration.

The first waveguide 12 extends in the longitudinal direction Z between a first entry plane 12e and a first exit plane 12s. Each first plane 12e and 12s is a plane perpendicular to the longitudinal direction Z.

The first core 22 is formed by a layer extending along the longitudinal direction Z. The first core 22 has a dimension e22 along the transverse direction X of 1.5 microns (μm) and a dimension l22 along the longitudinal direction Z of several millimeters. However, its dimension along the longitudinal direction along a coupling zone (defined by the overlap with the second core 30) is typically approximately 100 μm.

The first core 22 is, for example, a heterostructure made from a first material in a mixture made up of Aluminum (Al), Indium (In), and Arsenic (As) (with formula AlInAs) and a second material that is a mixture made up of Gallium (Ga), Indium (In), and Arsenic (As) (with formula GaInAs). Hereinafter, the index nc1 of the first core 22 is equal to 3.3, which mathematically translates to nc1=3.3.

More generally, the first core 22 is made from a gain material, i.e., a material capable of generating the stimulated emission of photons following an excitation.

The first cladding 24 has a first upper layer 26 and a first lower layer 28, the first core 22 being arranged between the first upper layer 26 and the first lower layer 28.

The first upper layer 26 has a dimension e26 along the transverse direction X of approximately 1 µm and a dimension l26 along the longitudinal direction Z of approximately 100 µm.

The first lower layer 28 has a dimension e28 along the transverse direction X of approximately 1 µm and a dimension l28 along the longitudinal direction Z of approximately 100 µm.

According to the example of FIG. 1, the first upper layer 26 and the first lower layer 28 are made from the same material. This material is the material from which the first cladding 24 is made.

In the illustrated case, the material is indium phosphorus.

Alternatively, the first upper layer 26 and the first lower layer 28 are made from two different materials.

The index ng1 of the first cladding 24 is then equal to 3.1, which mathematically translates to ng1=3.1.

The first waveguide 12 forms an active waveguide. "Active waveguide" refers to a waveguide including at least one layer formed from an active material capable of generating a wave. In the case of FIG. 1, the first core 22 is such a layer.

More specifically, the first waveguide 12 is a laser waveguide, i.e., a laser source. The first waveguide 12 is for example a so-called quantum cascade laser source (more often designated using its acronym, QCL). Such a waveguide 12 is capable of generating laser waves with a wavelength of 4.5 µm.

The first waveguide 12 is capable of propagating the waves according to propagation modes respectively corresponding to an effective index. In fact, depending on the field distribution, each propagation mode sees a different index of the materials making up the waveguide depending on each propagation mode. The index seen by each propagation mode defines the effective index.

The second waveguide 14 extends in the longitudinal direction Z between a second entry plane 14e and a second exit plane 14s. Each second plane 14e and 14s is a plane perpendicular to the longitudinal direction Z. The first exit plane 12s is positioned between the first entry plane 12e and the second exit plane 14e.

According to one alternative, the second entry plane 14e is positioned between the first entry plane 12e and the first exit plane 12s.

The second core 30 is formed by a layer extending along the longitudinal direction Z. The second core 30 has a dimension e30 along the transverse direction X of 0.61 µm and a dimension l22 along the longitudinal direction Z is 150 µm.

The second core 30 is for example made from silicon-germanium. As a result, the index nc2 of the second core 30 is equal to 3.6, which mathematically translates to nc2=3.6.

The second cladding 32 includes a second upper layer 34 and a second lower layer combined with the substrate 18.

Alternatively, the second cladding 32 comprises a second lower layer distinct from the substrate 18.

The second upper layer 34 has a dimension e34 along the transverse direction X of approximately 1 µm and a dimension l34 along the longitudinal direction Z of approximately 100 µm.

The second cladding 32 is for example made from silicon. The index ng2 of the second cladding 32 is then equal to 3.4, which mathematically translates to ng2=3.4.

The second waveguide 14 is a passive waveguide, i.e., a waveguide not including a layer made from an active material.

The second waveguide 14 is buried in the substrate 18, i.e., it is optically insulated from the surrounding medium. For example, the second waveguide 14 is arranged at a distance of 5 mm from the first waveguide 12 along the transverse direction X. The second waveguide 14 is capable of allowing the propagation of propagation modes each corresponding to an effective index.

The substrate 18 is formed by a layer extending along the longitudinal direction Z extending between an entry plane 18e and an exit plane 18f. According to the example of FIG. 1, the exit plane 18f of the substrate 18 is combined with the second exit plane 14s, while the first entry plane 12e is between the entry plane 18e of the substrate 18 and the first exit plane 12s.

The substrate 18 has a dimension e18 along the transverse direction of several microns and a dimension l18 along the longitudinal direction Z of approximately one hundred microns.

The substrate 18 is for example made from silicon. The index ns18 of the substrate 18 is then equal to 3.4, which mathematically translates to ns18=3.4.

More generally, according to one preferred embodiment, the material of the substrate 18 is different from the materials of the different layers (first upper layer 26, first lower layer 28 and first core 22) of the first waveguide 12. As a result, reference is made to a heterogeneous integration of the first waveguide 12 on the substrate 18.

The third waveguide 16 extends along the longitudinal direction Z between a third entry plane 16e and a third exit plane 16s. Each third plane 16e and 16s is a plane perpendicular to the longitudinal direction Z. The third entry plane 16e is positioned between the entry plane 18e of the substrate 18 and the first entry plane 12e. The third exit plane 16s is positioned between the second entry plane 14e and the second exit plane 14s.

Alternatively, the third entry plane 16e is positioned between the first entry plane 12e and the first exit plane 16s.

Furthermore, the third waveguide 16 is arranged between the first waveguide 12 and the second waveguide 14. Thus, it may be considered that the third waveguide is adjacent on the one hand to the first waveguide 12 and adjacent on the other hand to the second waveguide 14.

The third waveguide 16 includes a third core 36 and a third cladding 38.

The third core 36 is formed by a layer extending along the longitudinal direction Z. The third core 36 has a dimension e36 along the transverse direction X and a dimension l36 along the longitudinal direction Z.

The third core 26 is made from a material having an index denoted nc3. The third cladding 38 has a third upper layer 40 and a third lower layer 42, the third core 36 being arranged between the third upper layer 40 and the third lower layer 42.

Thus, the third upper layer 40 is arranged between the first lower layer 22 and the third core 36.

The third upper layer 40 has a dimension e40 along the transverse direction X and a dimension l40 along the longitudinal direction Z.

The third upper layer 40 is made from a material having an index denoted n40.

The third lower layer 42 is arranged between the third core 36 and the second upper layer 34.

The third lower layer 42 has a dimension e42 along the transverse direction X and a dimension l42 along the longitudinal direction Z.

The third lower layer 42 is made from a material having an index denoted n42.

The third waveguide 16 is a passive waveguide. The third waveguide 14 is thus capable of allowing the propagation of propagation modes each corresponding to an effective index.

It appears that the third waveguide 16 is characterized by a plurality of parameters that are, for each of the three layers (third core 26, upper layer 40 and lower layer 42), the dimension of the layer considered along the longitudinal direction Z, the dimension of the layer considered along the transverse direction X, and the index in which the considered layer is made. The parameters that characterize the third waveguide 16 are parameters influencing the coupling between the first waveguide 12 and the second waveguide 14.

Alternatively, other parameters are used to characterize the third waveguide 16. In particular, a linear combination of the dimension parameters of the layer considered along the longitudinal direction Z and dimensions of the layer considered along the transverse direction X is interesting.

As an example, instead of using the aforementioned dimensions, the distances d1 and d2 are used, which are respectively defined as the distance between the first waveguide 12 and the second waveguide 14 in the transverse direction X, and the distance between the first waveguide 12 and the third waveguide 16 in the transverse direction X. For example, the distance between two waveguides in the transverse direction X is the distance between the cores of the waveguides and the transverse direction X. The distance between the third entry plane 16e and the first entry plane 12e in the longitudinal direction Z or the distance between the third exit plane 16s and the second entry plane 14e in the longitudinal direction Z are other examples of parameters that can be taken into account. According to the invention, the parameters characterizing the third waveguide 16 verify a first property denoted P1. The first property P1 is verified when the evanescent wave coupling between the first waveguide 12 and the second waveguide 14 is greater than 15%. As a reminder, in the context of the invention, it is chosen to express the coupling as the ratio between the intensity of the electric field of the wave circulating in the second waveguide 14 and the sum of the intensities of the electric fields of the wave circulating in the first waveguide 12 and the second waveguide 14. Hereinafter, the coupling thus defined is denoted "C", which is a number with no unit.

In a manner known in itself, for an imposed evanescent wave coupling, one skilled in the art is capable of determining the missing parameters of the coupler 10 that need to be chosen. In fact, the transfer of light from one waveguide to another waveguide implies that the guided propagation modes of each guide are close enough to each other for their evanescent part to have a non-zero overlap. The optimal coupling length then depends on this overlap, which in turn depends on optogeometric characteristics of the considered waveguides.

For example, it is known from the book entitled *Optical waveguide theory* by A. W. Sneider and J. D. Love, published by Chapman and Hall in 1983, that for two waveguides A and B close enough for the evanescent part of the propagation modes of the waves circulating in those two guides to overlap, the length $L_c$ corresponding to the maximum coupling from the waveguide A toward the waveguide B to the other may be written:

$$Lc = \frac{\pi}{\sqrt{K^2 + \delta^2}}$$

Where:

$$\delta = \frac{\pi}{\lambda}(n_{effA} - n_{effB})$$

where
$\lambda$ is the length in the vacuum,
$n_{effA}$ is the effective index of the considered propagation mode circulating in the waveguide A, and
$n_{effB}$ is the effective index of the considered propagation mode circulating in the waveguide B, $$K = \sqrt{\frac{\varepsilon_0}{\mu_0}} \frac{k}{4} \int_{S_B} \Delta(n^2) E_a E_b^* dA$$

where
$\varepsilon_0$ is the dielectric permeability in the vacuum,
$\mu_0$ is the magnetic permeability in the vacuum,
k is the number of waves associated with the wavelength $\lambda$,
$\Delta(n^2)$ is the squared index difference between the index of the core of the waveguide B and the index of the cladding of the waveguide A,
$E_a$ is the electric field of the considered propagation mode in the waveguide A,
$E_b$ is the electric field of the considered propagation mode in the waveguide B,
"*" designates the mathematical conjugation operation, and
$S_B$ is the core section of the waveguide B.

In order to perform the calculations, one skilled in the art usually uses digital simulation tools in particular to calculate the fields of the propagation modes of the waveguides A and B.

To manage to determine the different parameters in the context of the invention, the preceding formula should be used to optimize the coupling between the first waveguide 12 and the third waveguide 14 on the one hand, and the coupling between the third waveguide 14 and the first waveguide 12 on the other hand. The details of the equations associated with this double optimization are not described in more detail, since one skilled in the art is capable of extending the concept proposed for two waveguides A and B to the three waveguides 12, 14, 16 of the coupler 10.

Implementing such an optimization leads, in the case of FIG. 1, for example, to the following choice.

The third core 36 is for example made from germanium. As a result, the index nc3 of the third core 36 is equal to 4.0, which mathematically translates to nc3=4.0.

The dimension e36 along the transverse direction X of the third core 30 is 0.4 μm and the dimension l36 along the longitudinal direction Z of the third core 30 is approximately one hundred microns.

The two upper 40 and lower 42 third layers are made from a same material, in this case zinc sulfide. The index n40 of the upper layer 40 is therefore equal to the index n42 of the lower layer 42, which mathematically translates to n40=n42=2.2. The value of 2.2 corresponds to the index of the zinc sulfide.

The dimension e40 along the transverse direction X and the dimension l40 along the longitudinal direction Z of the third upper layer 40 are respectively approximately one micron and approximately one hundred microns.

The dimension e42 along the transverse direction X and the dimension l42 along the longitudinal direction Z of the third lower layer 42 are respectively approximately one micron and approximately one hundred microns.

The operation of the optical coupler 10 according to the invention will now be described.

When the first waveguide 12 is supplied with power, the first waveguide 12 emits light in the form of waves guided in the first core 22.

Part of the waves guided in the first core 22 then couples with the third waveguide 16 by evanescent waves. Waves are then guided in the third core 36.

Part of the waves guided in the third core 36 then couples with the second waveguide 14 by evanescent waves. Waves are then guided in the second core 30.

The coupler 10 makes it possible to couple light guided in the first core 22 toward the second waveguide 30 via the third waveguide 16. The third waveguide therefore serves as an intermediate waveguide.

FIGS. 2 and 3 are simulations showing the distribution of the light energy in the optical coupler 10 according to FIG. 1. Upon observing FIG. 3, it appears that on the entry plane 12e of the first waveguide 12, the intensity of the electric field is 100%, whereas on the exit plane 14s of the second waveguide 14, the intensity of the electric field is 20%, which shows that the coupling C is approximately 20%.

This shows that the parameters chosen for the coupler 10 of FIG. 1, i.e., for each of the three layers (third core 26, upper layer 40 and lower layer 42), the dimension along the longitudinal direction Z of the considered player, the dimension along the transverse direction X of the considered layer and the optical index in which the considered layer is made, verify the property P1.

The coupling C obtained upon studying FIG. 3 should be compared to the coupling obtained with an optical coupler according to the state of the art.

Such an optical coupler according to the state of the art is a coupler without a third intermediate waveguide.

In that case, FIGS. 4 and 5 are obtained by simulation. Upon studying FIG. 5, it is observed that the coupling C is low, approximately 10%. In other words, using the coupler 10 according to the invention makes it possible to obtain a gain by a factor two in terms of coupling.

This better coupling is obtained while preserving easy manufacturing. To illustrate this advantage, it is now described in reference to FIGS. 6 to 13.

As appears upon studying the values of the example of FIG. 1, in the absence of the third waveguide 14, since the index ng2 of the second gain is greater than the index nc1 of the first core 20, the coupling is physically impossible. The introduction of the third waveguide 14 makes it possible, for each waveguide, for the index of the cladding of the waveguide to be below the indices of the core(s) of each adjacent waveguide.

The manufacturing method first includes the deposition of a silicon substrate 18. For example, the deposition step 102 is for example implemented using a technique known in itself for chemical vapor deposition (CVD) or physical vapor deposition (PVD). The obtained substrate layer 18 is diagrammatically illustrated in FIG. 6.

The manufacturing method next includes manufacturing a silicon and germanium layer 100 on the silicon substrate 18. According to the proposed example, the manufacturing is implemented using silicon and crystalline germanium epitaxy. Epitaxy is an ordered growth technique of two materials (in this case, silicon and germanium) relative to one another that have a certain number of shared symmetrical elements in their crystalline networks. The assembly of the substrate layer 18 and the silicon and germanium layer 100 obtained at the end of this step of the method is diagrammatically illustrated in FIG. 7.

The method next comprises a lithography step done in the silicon-germanium layer so as to cut out a part of the layer 100 to obtain a layer forming the second core 30 of the second waveguide 14. The assembly of the substrate layer 18 and the second core 30 obtained at the end of this step of the method is diagrammatically illustrated in FIG. 8.

The method subsequently includes a step for manufacturing a silicon layer so as to form the substrate 18 (the substrate being the base mechanical support on which the thin layers are deposited) and the upper layer 32 of the second waveguide 14. This manufacturing step successively includes an epitaxy step of the layer and polishing step of the layer. According to the illustrated method example, the polishing step is carried out using a chemical mechanical polishing (CMP) technique. The assembly of the substrate 18 and the second waveguide 14 obtained at the end of this step of the method is diagrammatically illustrated in FIG. 9.

The method next comprises a deposition step making it possible to form an assembly 102 of three layers designed to form the third waveguide 16. The assembly 102 of three layers comprises a first layer 104 designed to form the third lower layer 42, a second layer 106 designed to form the third core 36, and a third layer 108 designed to form the third upper layer 40. The deposition step first comprises depositing the first layer 104 of zinc sulfide on the assembly of the substrate 18 and the second waveguide 14, then depositing the second layer 106 of germanium on the first layer 104, and lastly depositing the third layer 108 of zinc sulfide on the second layer 106. The assembly of the substrate 18, the second waveguide 14 with the assembly 102 of three layers 104, 106, 108 obtained at the end of this step of the method is diagrammatically illustrated in FIG. 10.

The method next comprises a lithography step done in the assembly 102 of three layers 104, 106, 108 so as to cut out a part of the three layers 104, 106, 108 to obtain a layer forming the third waveguide 16. The lithography step makes it possible to dimension the assembly 102 to the desired size for the third waveguide 16. The assembly of the substrate 18, the second waveguide 14 and the third waveguide 16 obtained at the end of this step of the method is illustrated in FIG. 11.

The method next includes a step for manufacturing silicon parts 110, 112 on either side of the third waveguide 16, so as to bury the second waveguide 14 in the substrate 18. This manufacturing step successively includes a step for epitaxy of the parts 110, 112 and a step for polishing of the parts 110, 112 and the upper third part 40. According to the illustrated example method, the polishing step is carried out using a CMP technique. The assembly of the substrate 18, the second waveguide 14 and the third waveguide 16 obtained at the end of this step of the method is illustrated in FIG. 12.

The method lastly includes a step for gluing the first waveguide 12, the result of which is illustrated by FIG. 13. The gluing step may be gluing by molecular adhesion. It is also possible to perform gluing by simple epitaxy (thin layers), then produce the waveguides 12 using techniques similar to those used for the waveguide 14.

The method therefore makes it possible to obtain the optical coupler 10. Implementing this method involves only the use of proven technologies in the context of the manufacture of planar components, and more particularly components made from a semiconductor material. In particular, such a manufacturing method does not involve implementing a technology for immersion in molten salt baths, which is a delicate technology to carry out. As a result, the method according to the invention is particularly easy to implement.

Furthermore, the optical coupler 10 has the advantage of not imposing constraints on the shape of the first waveguide 12 and the second waveguide 14. The first waveguide 12 and the second waveguide 14 can therefore be optimized to provide an optimal output (ratio between the output power of the considered device and the incident power on the considered device) without deteriorating the coupling C.

Alternatively, it should be noted that it is possible to design multiple optical couplers 10 whereof the parameters of the third waveguide 16 verify the property P1 relative to the coupling C. These couplers also reduce leaks in the cladding of the second waveguide of the guided mode in the first core 22.

In particular, different materials can be considered to produce the third core 36, the upper third layer 40 and the lower third layer 42. Specifically, semiconductor materials of type "III-V" can be considered.

One criterion for choosing the materials can also be the ease of manufacturing. For example, it is easier to make the third core 36 from germanium.

These remarks on the materials apply to the materials of all of the layers involved in the coupler 10.

Furthermore, different forms may be considered for the layers 36, 40, 42 forming the third waveguide 16.

This is in particular the case for the coupler 10 according to a second embodiment described in reference to FIG. 14.

The identical elements between the coupler 10 according to the second embodiment and the coupler 10 according to the first embodiment are not repeated. Only the differences are highlighted.

In the case of FIG. 14, the third core 36 has a dimension along the transverse direction X that increases when the third core 36 is traveled along the longitudinal direction Z.

According to the second embodiment, the growth is linear between an initial value e36$i$ and a final value e36$f$. The initial value e36$i$ is the value of the dimension along the transverse direction X of the third core 36 at a first end of the third core 36, while the final value e36$f$ is the value of the dimension along the transverse direction X of the third core 36 at a second end of the third core 36. In this particular case, the initial value e36$i$ is equal to 0.4 μm, and the final value e36$f$ is equal to 0.61 μm.

Variations of the dimension along the transverse direction X other than a linear variation can be considered, a linear variation never the less having the advantage of being easy to produce with the planar manufacturing technologies known from the state of the art.

FIGS. 15 and 16 are simulations showing the distribution of the light energy in the optical coupler 10 according to FIG. 14. Upon observing FIG. 16, it appears that the intensity of the electric field is 100% in the entry plane 12$e$ of the first waveguide 12, while in the exit plane 14$s$ of the second waveguide 14, the intensity of the electric field is 80%, which shows that the coupling C is approximately 80%. This corresponds to a gain by a factor 8 in the intensity in the second waveguide 14 relative to the state of the art.

This example also shows that preferably, to obtain the best coupling, the parameters characterizing the third waveguide 16 alternatively verify a second property denoted P2. The second property P2 is verified when the evanescent wave coupling C between the first waveguide 12 and the second waveguide 14 is greater than 30%.

Still more advantageously, alternatively, the parameters characterizing the third waveguide 16 verify a third property denoted P3. The third property P3 is verified when the evanescent wave coupling C between the first waveguide 12 and the second waveguide 14 is greater than 50%.

According to other alternatives, it is also possible to consider more complex patterns. As an example, the optical coupler 10 includes a plurality of intermediate waveguides. In that case, all of the parameters characterizing the intermediate waveguides are such that the evanescent wave coupling between the first waveguide 12 and the second waveguide 14 is greater than 15% (30%, 50%, respectively, depending on the selected property). Waveguides 12, 14 and 16 provided with effective index adaptation means can also be considered.

Due to the multiplicity of the optical couplers 10 meeting properties P1, P2 or P3, it is also proposed, in the context of this invention, to have a method for determining parameters including a step for choosing parameters such that the coupling C is greater than 15%, 30% or 50%.

The optical coupler 10 obtained is in particular especially interesting in the case of an integrated gas sensor. More generally, such an optical coupler 10 can be used in any optical component for which it is favorable to implement a heterogeneous integration.

It should also be noted that the optical coupler 10 is also applicable in the case where the first waveguide 12 is not an active waveguide. As an example, the first waveguide 12 is an infrared detector comprising an absorbing material at the wavelength of interest with a layer of material that is transparent at that same wavelength of interest. In the telecommunications field, where the optical chip is used to perform optical signal processing (for example, demultiplexing, etc.), it may be interesting to integrate the detectors directly on the chip for greater compactness.

The invention claimed is:

1. An optical coupler in a vertical configuration, comprising:
a first waveguide extending in a longitudinal direction, the first waveguide including a first core and a first cladding each having an optical index,
a second waveguide distinct from the first waveguide, extending parallel to the first waveguide, the second waveguide including a second core and a second cladding having an optical index, the optical index of the first core of the first waveguide being lower than the optical index of the second cladding of the second waveguide,
the optical coupler further comprising:
a third waveguide distinct from the first and second waveguides and extending parallel to the first and second waveguides, the third waveguide being arranged between the first waveguide and the second waveguide in a transverse direction perpendicular to the longitudinal direction and having parameters influencing the evanescent wave coupling between the first waveguide and the second waveguide, those parameters being chosen such that the coupling is greater than 15%.

2. The optical coupler according to claim 1, wherein the optical coupler includes a substrate, made from a first material that is preferably silicon, in which the second waveguide and the third waveguide are buried, the first waveguide being arranged in contact with the substrate and made from a material different from the first material.

3. The optical coupler according to claim 1, wherein said parameters of the third waveguide influencing the evanescent wave coupling between the first waveguide and the second waveguide are chosen such that the coupling is greater than 30%, preferably greater than 50%.

4. The optical coupler according to claim 1, wherein the third waveguide includes an upper layer, a lower layer and a third core, said parameters of the third waveguide influencing the evanescent wave coupling between the first waveguide and the second waveguide being the dimensions in two perpendicular directions as well as the optical indices of the upper layer, the lower layer and the third core.

5. The optical coupler according to claim 1, wherein the third waveguide includes a third cladding and a third core, each cladding of a waveguide having an optical index lower than the optical index of the core of each waveguide adjacent to the waveguide of the considered cladding.

6. The optical coupler according to claim 1, wherein the first waveguide is an active waveguide and the second and third waveguides are passive waveguides.

7. The optical coupler according to claim 1, wherein the first core is made from a material belonging to column III of the periodic table formed with a material according to column V of the periodic table and two lower and upper layers surrounding the core.

8. The optical coupler according to claim 1, wherein the third waveguide includes an upper layer, a lower layer and a core, the third core of the third waveguide having a variable dimension along the transverse direction.

9. The optical coupler according to claim 1, wherein the second waveguide is at a distance of at least 5 millimeters from the first waveguide in the transverse direction.

10. The optical coupler according to claim 1, wherein the optical coupler further comprises a fourth waveguide distinct from the first, second and third waveguides and extending parallel to the first, second and third waveguides, the fourth waveguide being arranged between the third waveguide and the second waveguide and having parameters influencing the evanescent wave coupling between the first waveguide and the second waveguide, the set of parameters of the third waveguide and the fourth waveguide being chosen such that the coupling is greater than 15%.

11. The optical coupler according to claim 10, wherein the parameters of the third waveguide and the fourth waveguide influencing the evanescent wave coupling between the first waveguide and the second waveguide are chosen such that the coupling is greater than 30%, preferably greater than 50%.

12. A method for manufacturing an optical coupler according to claim 1 wherein the method for manufacturing comprises steps for manufacturing different waveguides by a technique selected from the group consisting of deposition, epitaxy, polishing, gluing and material removal by etching.

13. A method for determining parameters of an optical coupler in a vertical configuration, comprising:
    a first waveguide extending in a longitudinal direction, the first waveguide including a first core and a first cladding each having an optical index,
    a second waveguide distinct from the first waveguide and extending parallel to the first waveguide, the second waveguide including a second core and a second cladding having an optical index, the optical index of the first core of the first waveguide being lower than the optical index of the second cladding of the second waveguide
    a third waveguide distinct from the first and second waveguides and extending parallel to the first and second waveguides, the third waveguide being arranged between the first waveguide and the second waveguide in a transverse direction perpendicular to the longitudinal direction and having parameters influencing the evanescent wave coupling between the first waveguide and the second waveguide, the method for determining including a step for choosing parameters such that the coupling is greater than 15%.

* * * * *